(12) United States Patent
Lin et al.

(10) Patent No.: US 12,050,374 B2
(45) Date of Patent: Jul. 30, 2024

(54) ELECTRONIC DEVICE

(71) Applicant: InnoLux Corporation, Miao-Li County (TW)

(72) Inventors: Bi-Ly Lin, Miao-Li County (TW); Yeong-E Chen, Miao-Li County (TW)

(73) Assignee: INNOLUX CORPORATION, Chu-Nan (TW)

( * ) Notice: Subject to any disclaimer, the term of this patent is extended or adjusted under 35 U.S.C. 154(b) by 0 days.

(21) Appl. No.: 17/698,216

(22) Filed: Mar. 18, 2022

(65) Prior Publication Data
US 2022/0334423 A1    Oct. 20, 2022

(30) Foreign Application Priority Data
Apr. 20, 2021 (CN) .......................... 202110427653.8

(51) Int. Cl.
| G02F 1/133 | (2006.01) |
| G02C 7/06 | (2006.01) |
| G02F 1/1343 | (2006.01) |
| G02F 1/137 | (2006.01) |
| G02F 1/29 | (2006.01) |
| H01L 31/054 | (2014.01) |

(52) U.S. Cl.
CPC ......... *G02F 1/13324* (2021.01); *G02C 7/066* (2013.01); *G02F 1/134309* (2013.01); *G02F 1/294* (2021.01); *H01L 31/054* (2014.12); *G02F 1/13725* (2013.01); *G02F 1/13775* (2021.01)

(58) Field of Classification Search
CPC ..... G02F 1/13324; G02F 1/294; H01L 31/054
See application file for complete search history.

(56) References Cited

U.S. PATENT DOCUMENTS

| 2005/0213027 A1* | 9/2005 | Blum ............... B29D 11/00817 351/159.1 |
| 2006/0074461 A1* | 4/2006 | Tano ................. A61N 1/36046 607/54 |
| 2007/0146910 A1* | 6/2007 | Duston .................... G02F 1/29 359/834 |
| 2020/0089025 A1* | 3/2020 | Li .......................... G02C 7/101 |

\* cited by examiner

*Primary Examiner* — Lucy P Chien
(74) *Attorney, Agent, or Firm* — Muncy, Geissler, Olds & Lowe, P.C.

(57) ABSTRACT

An electronic device includes a solar cell, a first light modulating layer, a transmittance-adjustable lens and a control circuit. At least a portion of the first light modulating layer is disposed on the solar cell. The control circuit is electrically connected to the solar cell and the transmittance-adjustable lens.

18 Claims, 11 Drawing Sheets

ELECTRONIC DEVICE

CROSS REFERENCE TO RELATED APPLICATION

This application claims the benefits of the Chinese Patent Application Serial Number 202110427653.8, filed on Apr. 20, 2021, the subject matter of which is incorporated herein by reference.

BACKGROUND

1. Field of the Disclosure

The present disclosure relates to an electronic device and, more particularly, to an electronic device equipped with a solar cell.

2. Description of Related Art

With the development of science and technology, solar cells have been in widespread use in various electronic devices, such as smart eyeglasses. However, because the electronic device has an upper limit on the energy that can be received, when the ambient light is too strong (for example, outdoors at noon), the energy provided by the solar cell may exceed the upper limit that the electronic device can receive, and the excess energy will be converted into heat energy and concentrated at the solar cell, which is likely to cause damage.

Therefore, there is a need for an improved electronic device to mitigate or obviate the aforementioned problems.

SUMMARY

The present disclosure provides an electronic device including a solar cell, a first light modulating layer, a transmittance-adjustable lens, and a control circuit. At least a portion of the first light modulating layer is disposed above the solar cell. The control circuit is electrically connected to the solar cell and the transmittance-adjustable lens.

Other novel features of the disclosure will become more apparent from the following detailed description when taken in conjunction with the accompanying drawings.

DETAILED DESCRIPTION OF EMBODIMENT

Figure 1A:
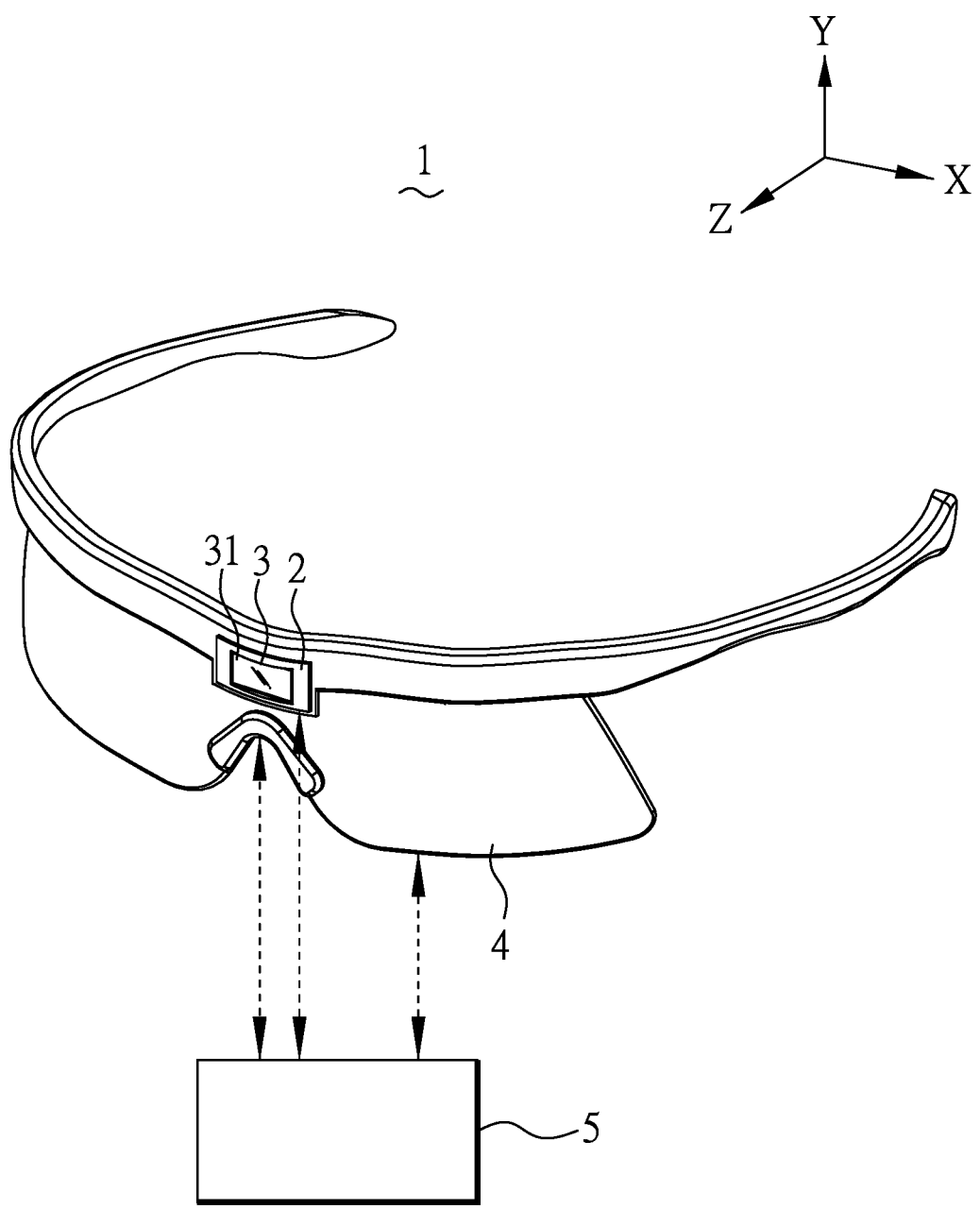
FIG. 1(A) is a schematic diagram of the electronic device according to some embodiments of the present disclosure.

The implementation of the present disclosure is illustrated by specific embodiments to enable persons skilled in the art to easily understand the other advantages and effects of the present disclosure by referring to the disclosure contained therein. The present disclosure is implemented or applied by other different, specific embodiments. Various modifications and changes can be made in accordance with different viewpoints and applications to details disclosed herein without departing from the spirit of the present disclosure.

It is noted that, in the specification and claims, unless otherwise specified, having "one" element is not limited to having a single said component, but one or more said components may be provided.

In addition, in the specification and claims, unless otherwise specified, ordinal numbers, such as "first" and "second", used herein are intended to distinguish components rather than disclose explicitly or implicitly that names of the components bear the wording of the ordinal numbers. The ordinal numbers do not imply what order a component and another component are in terms of space, time or steps of a manufacturing method.

In addition, the term "adjacent" used herein may refer to describe mutual proximity and does not necessarily mean mutual contact.

In addition, when a component or a film layer is referred to as being on another component or another film layer, or is referred to as being connected to another component or another film layer, it shall be understood as the component or the film layer is directly disposed on another component or another film layer, or directly connected to another component or another film layer, or there may be other components or film layers between the two (indirectly disposed/connected). On the contrary, when a component or film layer is said to be "directly disposed" on another component or film layer or "directly connected" to another component or film layer, it should be understood that there is no component or film layer inserted between the two. When referring to "on" or "above", it includes the case of direct contact, or there may be one or more other components between the two, in which case there may not be direct contact between the two.

In this disclosure, the thickness, length and width may be measured by using an optical microscope, and the thickness may be measured by the cross-sectional image in an electron microscope, but it is not limited thereto. In addition, there may be a certain error in any two values or directions used for comparison. If the first value is equal to the second value, it implies that there may be an error of about 10% between the first value and the second value. If the first direction is perpendicular to the second direction, the angle between the first direction and the second direction may be 80 to 100 degrees. If the first direction is parallel to the second direction, the angle between the first direction and the second direction may be 0 to 10 degrees.

Unless otherwise defined, all terms (including technical and scientific terms) used here have the same meanings as commonly understood by those skilled in the art of the present disclosure. It is understandable that these terms, such as those defined in commonly used dictionaries, should be interpreted as having a meaning consistent with the relevant technology and the background or context of the present disclosure, rather than in an idealized or excessively formal interpretation, unless specifically defined.

In addition, the description of "when . . ." or "while . . ." in the present disclosure means "now, before, or after", etc., and is not limited to occurrence at the same time. In the present disclosure, the similar description of "disposed on" or the like refers to the corresponding positional relationship between the two components, and does not limit whether there is contact between the two components, unless specifically limited. Furthermore, when the present disclosure recites multiple effects, if the word "or" is used between the effects, it means that the effects can exist independently, but it does not exclude that multiple effects can exist at the same time.

In addition, the terms "connect" or "couple" in the specification and claims not only refer to direct connection with another component, but also indirect connection with another component, or refer to electrical connection. Besides, the electrical connection may include a direct connection, an indirect connection (for example, through an active component or a passive component), or a mode in which two components communicate through radio signals.

In this disclosure, the term "almost", "about", "approximately" or "substantially" usually means within 20%, 10%, 5%, 3%, 2%, 1% or 0.5% of a given value or range. The quantity the given value is an approximate quantity, which means that the meaning of "almost", "about", "approximately" or "substantially" may still be implied in the absence of a specific description of "almost", "about", "approximately" or "substantially". In addition, the terms "ranging from the first value to the second value" and "range between the first value and the second value" indicate that the range includes the first value, the second value, and other values between the first value and the second value.

It should be understood that, without departing from the spirit of the present disclosure, in the following embodiments, the features in different embodiments may be replaced, reorganized or mixed to accomplish other embodiments. The features among various embodiments may be mixed and matched arbitrarily as long as they do not violate the spirit of the disclosure or conflict with each other.

In addition, the electronic device disclosed in the present disclosure may include a display device, an antenna device, a sensing device, a touch display device, a curved display device, or a free shape display device, but is not limited thereto. The electronic device may be a bendable or flexible electronic device. The electronic device may include, for example, liquid crystal, light emitting diode, fluorescence, phosphor, other suitable display media, or a combination thereof, but is not limited thereto. The light emitting diode may include, for example, an organic light emitting diode (OLED), a sub-millimeter light emitting diode (mini LED), a micro light emitting diode (micro LED) or a quantum dot (QD) light emitting diode (for example, QLED, QDLED) or other suitable materials or a combination thereof, but is not limited thereto. The display device may include, for example, a tiled display device, but is not limited thereto. The antenna device may be, for example, a liquid crystal antenna, but is not limited thereto. The antenna device may include, for example, a tiled antenna device, but is not limited thereto. It should be noted that the electronic device may be a combination of the foregoing, but is not limited thereto. In addition, the appearance of the electronic device may be rectangular, circular, polygonal, a shape with curved edges, or other suitable shapes. The electronic device may have peripheral systems such as a driving system, a control system, a light source system, a shelf system, etc., to support a display device, an antenna device, or a tiled device. Hereinafter, the smart eyeglasses will be used as an electronic device for illustrative purpose only, but the disclosure is not limited thereto.

FIG. 1(A) is a schematic diagram of the electronic device 1 according to some embodiments of the present disclosure. The electronic device 1 is, for example, a pair of smart eyeglasses and, when the user wears the electronic device 1, the direction of the user's line of sight is defined as the Z direction, and the horizontal arrangement direction of the lens is defined as the X direction.

As shown in FIG. 1(A), the electronic device 1 includes a solar cell 2, a light modulating module 3, at least one transmittance-adjustable lens 4, and a control circuit 5. The light modulating module 3 includes a first light modulating layer 31. The control circuit 5 may be disposed inside the electronic device 1. FIG. 1(A) schematically illustrates that the electronic device 1 includes the control circuit 5, which does not mean that the control circuit 5 is placed outside the electronic device 1. When the incident light in the environment is emitted into the electronic device 1, the incident light will first pass through the first light modulating layer 31 of the light modulating module 3 and then reaches the solar cell 2. When receiving incident light, the solar cell 2 converts the received light energy into electrical energy and outputs the energy. The control circuit 5 is electrically connected to the solar cell 2, and is capable of receiving the energy provided by the solar cell 2. The control circuit 5 is also electrically connected to the transmittance-adjustable lens 4, and is capable of transmitting a control signal to the transmittance-adjustable lens 4.

In some embodiments, the solar cell 2 may include a plurality of photodiodes, and the photodiodes may form an array, but the present disclosure is not limited thereto.

In some embodiments, the material of the first light modulating layer 31 may include, for example, guest host type liquid crystal (GHLC), dye liquid crystal, twisted nematic liquid crystal (TN LC), super twisted nematic liquid crystal (STN LC), polymer dispersed liquid crystal (PDLC), cholesteric texture liquid crystal, polymer-stabilized cholesteric texture liquid crystal (PSCT LC), suspended particle material, electrochromic materials or polymer network liquid crystal (PNLC), but not limited thereto.

Figure 1B:
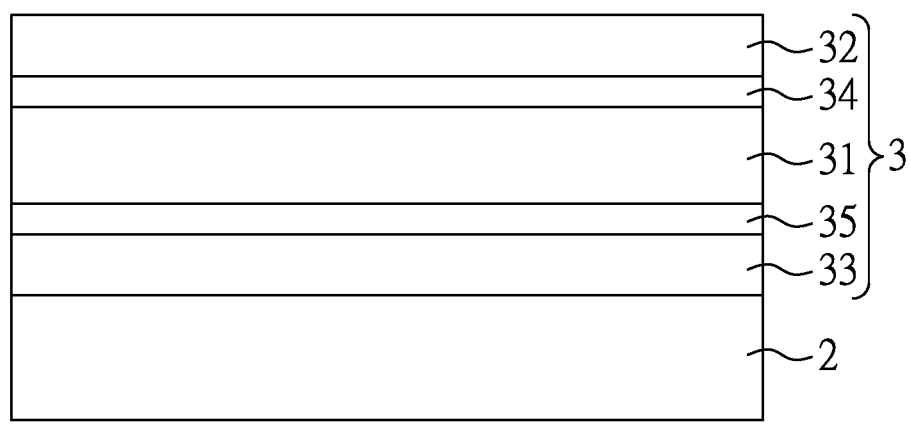
FIG. 1(B) is a schematic diagram illustrating the structure of a light modulating module of the electronic device according to some embodiments of the present disclosure.

The details of the first light modulating layer 31 and the light modulating module 3 are described hereinafter. FIG. 1(B) schematically illustrates a structure of the light modulating module 3 of the electronic device 1 according to some embodiments of the present disclosure. As shown in FIG. 1(B), the first light modulating layer 31 is disposed on the solar cell 2. In addition, the light modulating module 3 includes a first light modulating layer 31, a first plate 32, a second plate 33, a first electrode layer 34 and a second electrode layer 35, wherein the first light modulating layer 31 is sandwiched in between the first plate 32 and the second plate 33. In one embodiment, the second electrode layer 35 may be disposed on the second plate 33, the first light modulating layer 31 may be disposed between the second electrode layer 35 and the first electrode layer 34, and the first electrode layer 34 may be disposed between the first plate 32 and the first light modulating layer 31. In addition, the solar cell 2 and the first light modulating layer 31 can be separated by one of the plates. For example, the solar cell 2 and the first light modulating layer 31 may be separated by the second plate 33, but it is not limited thereto. In addition, the transmittance of the first light modulating layer 31 may be controlled and adjusted by, for example, applying different voltages to the first electrode layer 34 and the second electrode layer 35, so that the first light modulating layer 31 generates different driving states (for example, black mist state, white mist state or different transmittance states, but not limited thereto this) for changing the transmittance of the first light modulating layer 31. By adjusting the transmittance of the first light modulating layer 31, the energy received by the solar cell 2 (for example, the amount of incident light) can be adjusted. In addition, in the embodiment of FIG. 1, the first light modulating layer 31 is disposed in the light modulating module 3, and the first light modulating layer 31 and the solar cell 2 are separated by the second plate 33; however, in other embodiments, the first light modulating layer 31 and the solar cell 2 may also be sandwiched in between two plates (please refer to the embodiment of FIG. 8), but it is not limited thereto.

Next, the transmittance-adjustable lens 4 will be described, and please refer to FIG. 1(A) again. In some embodiments, each transmittance-adjustable lens 4 may also include a light modulating layer, wherein the material of the light modulating layer of the transmittance-adjustable lens 4 may be the same as that of the first light modulating layer 31 and thus a detailed description is deemed unnecessary. The transmittance of the transmittance-adjustable lens 4 may be adjusted through the control signal of the control circuit 5. In some embodiments, the control circuit 5 may determine the transmittance required by the transmittance-adjustable lens 4 in advance; for example, the control circuit 5 may be provided with control logic (such as, but not limited to, an algorithm), so as to set the transmittance required by the transmittance-adjustable lens 4 according to the ambient light around the electronic device 1, and change the transmittance of the transmittance-adjustable lens 4 by adjusting the voltage or current value of the control signal. Alternatively, the transmittance required by the transmittance-adjustable lens 4 may be a predetermined value, but it is not limited thereto. In some embodiments, the electronic device 1 may be designed to allow the user to adjust the transmittance of the transmittance-adjustable lens 4 by himself/herself. For example, the control circuit 5 may receive the user's instruction to adjust the voltage value or current value of the control signal thereby changing the transmittance of the transmittance-adjustable lens 4, but it is not limited thereto. In addition, in some embodiments, the transmittance of the transmittance-adjustable lens 4 may be set to have an inverse relationship with the magnitude of the control signal; that is, when the control signal is getting higher, the transmittance of the transmittance-adjustable lens 4 is getting lower so as to present lower brightness, but the present disclosure is not limited thereto.

In some embodiments, the control circuit 5 has an energy demand value (for example, the energy required for each transmittance-adjustable lens 4), so that, when the solar cell 2 provides energy to the control circuit 5, the control circuit 5 receives an amount of energy based on the energy demand value from the solar cell 2, and the remaining energy will be converted into heat energy or dissipated in other forms. In some embodiments, the transmittance required by the transmittance-adjustable lens 4 may be changed (for example, adjusted by the user or the intensity of the ambient light, but not limited thereto), and thus the energy demand value of the control circuit 5 may also be adjusted accordingly, so that the energy demand value is an adjustable value. In some embodiments, the energy demand value may also be an energy upper limit that the control circuit 5 can receive. However, the present disclosure is not limited thereto.

Incident light with excessively high energy may exceed the energy demand value or energy upper limit of the control circuit 5, and thus cause energy waste or increase the damage speed of the electronic component. In this regard, the electronic device 1 of the present disclosure is provided with a light modulating module 3 (including the first light modulating layer 31) disposed on the solar cell 2. By changing the transmittance of the first light modulating layer 31 of the light modulating module 3, the amount of incident light received by the solar cell 2 can be adjusted, so that the energy provided by the solar cell 2 may appropriately meet the energy demand value or the energy upper limit of the control circuit 5. In some embodiments, when the electronic device 1 is in a high-brightness environment (such as an outdoor environment with strong light), since the electronic device 1 of the present disclosure is provided with a light modulating module 3 (including the first light modulating layer 31) disposed on the solar cell 2, the amount of incident light received by the solar cell 2 can be adjusted by changing the transmittance of the first light modulating layer 31; for example, the amount of incident light received by the solar cell 2 can be reduced by decreasing the transmittance of the first light modulating layer 31. In some embodiments, when the electronic device 1 is in a low-brightness environment, the transmittance of the first light modulating layer 31 can be increased, so that the solar cell 2 may receive sufficient energy and provide the energy to the control circuit 5, so that the control circuit 5 may perform control on the transmittance-adjustable lens 4 (for example, provide a control signal). In some embodiments, since the solar cell 2 may control the transmittance-adjustable lens 4 in a low-brightness environment, the transmittance-adjustable lens 4 may still achieve the required transmittance in a low-brightness environment. For example, in the indoor environment, the transmittance-adjustable lens 4 may not be in a completely transparent state (non-transmittance being 100%), and thus, even in the indoor environment, the transmittance-adjustable lens 4 may be at least provided with the effect of slightly shading the eyes, which is advantageous in shading eye diseases or protecting the privacy.

Figure 2A:
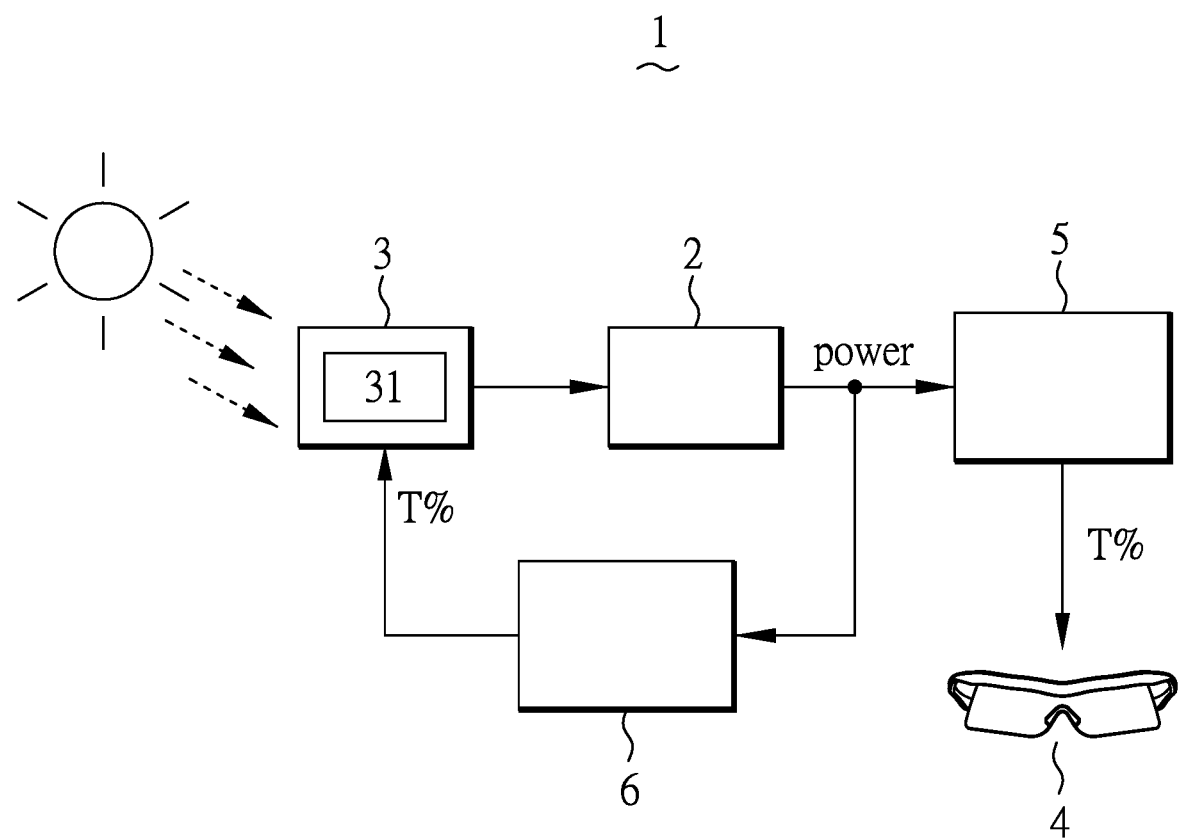
FIG. 2(A) is a schematic diagram illustrating the structure of the electronic device according to some embodiments of the present disclosure.

In order to achieve the aforementioned functions, the electronic device 1 of the present disclosure may have a special structure. FIG. 2(A) is a schematic diagram illustrating the structure of the electronic device 1 according to some embodiments of the disclosure, and please refer to FIG. 2(A) and FIGS. 1(A) and 1(B) at the same time, wherein all the components labeled in FIG. 2(A) are contained inside the electronic device 1, and it is noted that FIG. 2(A) is provided for clear illustration, instead of placing all the labeled components outside the electronic device 1.

As shown in FIG. 2(A), in addition to the aforementioned solar cell 2, the light modulating module 3 (including the first light modulating layer 31), the transmittance-adjustable lens 4 and the control circuit 5, the electronic device 1 may further include a light modulating layer control circuit 6.

The light modulating layer control circuit 6 is electrically connected to the solar cell 2 and the light modulating module 3. The light modulating layer control circuit 6 may also receive the energy provided by the solar cell 2, and transmit a light modulating layer control signal to the light modulating module 3 according to the received energy so as to adjust the transmittance of the first light modulating layer 31 of the light modulating module 3 thereby adjusting the energy radiated to the solar cell 2.

In some embodiments, in the light modulating layer control circuit 6, an energy threshold may be set in advance, and the energy provided by the solar cell 2 (for example, the energy provided to the control circuit 5) is compared with the energy threshold for determining the adjustment method of the transmittance of the first light modulating layer 31. In some embodiments, the energy threshold may be the energy demand value or the energy upper limit value of the control circuit 5.

In some embodiments, the incident light may be indoor incident light or outdoor incident light. For example, the energy of outdoor incident light is 10 to 30 times the energy of indoor incident light. Therefore, in an outdoor environment, the energy radiated to the solar cell 2 may be much higher than the energy threshold and, at this moment, the light modulating layer control circuit 6 may reduce the transmittance of the first light modulating layer 31 through the light modulating layer control signal, so as to reduce the intensity of the incident light emitted to the solar cell 2, and lower the energy provided by the solar cell 2 to the control circuit 5. In an indoor environment, the intensity of the incident light emitted to the solar cell 2 may be smaller than the energy threshold value and, at this moment, the light modulating layer control circuit 6 may increase the transmittance of the first light modulating layer 31 through the light modulating layer control signal, so as to raise the intensity of incident light emitted to the solar cell 2, and increase the energy provided by the solar cell 2. However, the present disclosure is not limited thereto.

In some embodiments, since the energy demand value of the control circuit 5 may be changed, the control circuit 5 may transmit the energy demand value to the light modulating layer control circuit 6, so that the light modulating layer control circuit 6 may adjust the energy threshold based on the energy demand value. However, the present disclosure is not limited thereto.

Figure 2B:
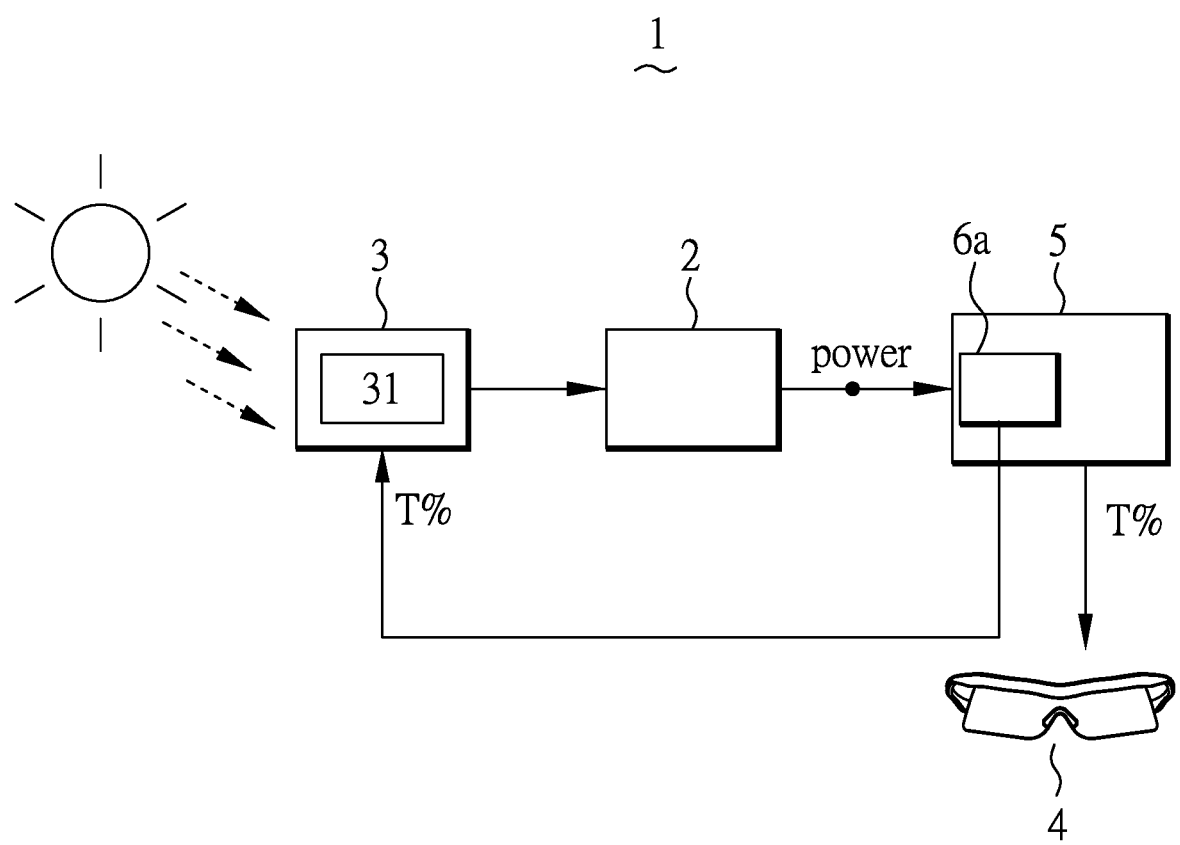
FIG. 2(B) is a schematic diagram illustrating the structure of the electronic device according to some embodiments of the present disclosure.

FIG. 2(B) is a schematic diagram illustrating the structure of the electronic device 1 according to some embodiments of the present disclosure, and please refer to FIG. 2(B) and FIGS. 1 and 2(A) at the same time, wherein all the components labeled in FIG. 2(B) are contained inside the electronic device 1, and it is noted that FIG. 2(B) is provided for clear illustration, instead of placing all the labeled components outside the electronic device 1

The control circuit 5 in the embodiment of FIG. 2(B) may include a maximum power point tracking (MPPT) circuit 6a, and the maximum power point tracking circuit 6a may be electrically connected to the light modulating module 3. The maximum power point tracking circuit 6a has a maximum power point tracking (MPPT) function, which may automatically adjust the transmittance of the first light modulating layer 31 of the light modulating module 3 according to the ambient light. Since the control circuit 5 of this embodiment includes the maximum power point tracking circuit 6a, the electronic device 1 may not be provided with the light modulating layer control circuit 6 in the embodiment of FIG. 2(A). In addition, in some embodiments, the maximum power point tracking circuit 6a may be disposed above the solar cell 2. However, the present disclosure is not limited thereto.

In view of the aforementioned description, the basic structure of the electronic device 1 can be understood.

Figure 3A:
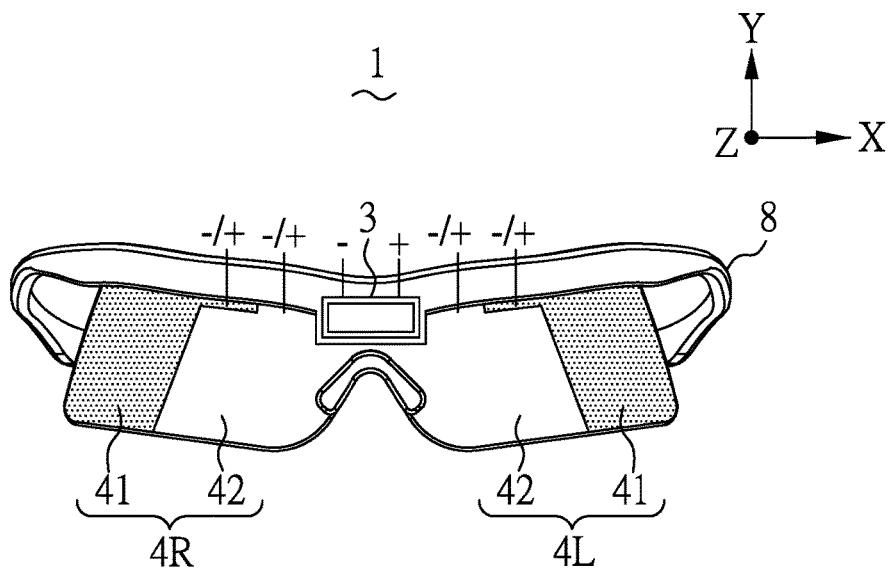
FIG. 3(A) is a schematic diagram of the light modulating module and the transmittance-adjustable lens according to some embodiments of the present disclosure.

Next, more details of the light modulating module 3 and the transmittance-adjustable lens 4 will be described. FIG. 3(A) is a schematic diagram of the light modulating module 3 and the transmittance-adjustable lens 4 according to some embodiments of the present disclosure, and please refer to FIG. 3(A) and FIGS. 1(A) to 2(B) at the same time.

As shown in FIG. 3(A), the electronic device 1 may include two, left and right, lenses (a transmittance-adjustable lens 4R and a transmittance-adjustable lens 4L). Each transmittance-adjustable lens 4R or 4L may include a first lens zone 41 and a second lens zone 42. The first lens zone 41 may be disposed at the side of the transmittance-adjustable lens 4, for example, adjacent to the eyeglasses temple 8 or farther from the solar cell 2 so as to block incident light emitted from the side. The second lens zone 42 may be disposed closer to the solar cell 2.

In some embodiments, according to the functions of the first lens zone 41 and the second lens zone 42, the first lens zone 41 may be provided with a lower transmittance, such as an approximately black mist state, so as to reduce light penetration, and the second lens zone 42 may be provided with a higher transmittance for allowing the user to have a normal view, but it is not limited thereto. In some embodiments, the transmittances of the first lens zone 41 and the second lens zone 42 may be the same, but it is not limited thereto.

Since the first lens zone 41 and the second lens zone 42 may be provided with different transmittances, the control circuit 5 may transmit different control signals to the first lens zone 41 and the second lens zone 42 to respectively control the transmittances of the first lens zone 41 and the second lens zone 42. For example, the control signal may include a first control signal and a second control signal. The first control signal is used to control the first lens zone 41 and the second control signal is used to control the second lens zone 42. However, the present disclosure is not limited thereto.

In some embodiments, the transmittance of the first lens zone 41 may be between 0.01% and 99.99%, but is not limited thereto. In some embodiments, the transmittance of the second lens zone 42 may be between 0.01% and 99.99%, but is not limited thereto. In some embodiments, the transmittance of the first lens zone 41 may be substantially the same as the transmittance of the second lens zone 42, but it is not limited thereto. In some embodiments, the transmittance of the first lens zone 41 may be different from the transmittance of the second lens zone 42; for example, the transmittance of the first lens zone 41 is lower than the transmittance of the second lens zone 42, but it is not limited thereto.

In some embodiments, the light modulating layers of the first lens zone 41 and the second lens zone 42 of the transmittance-adjustable lens 4R or 4L may be made of the same material, but it is not limited thereto. In some embodiments, the light modulating layers of the first lens zone 41 and the second lens zone 42 may be made of different materials. For example, the material of the light modulating layer of the first lens zone 41 may include cholesteric liquid crystal, such as polymer-stabilized cholesteric texture liquid crystal (PSCT LC), for achieving the effect of discoloration at different temperatures, but it is not limited thereto. The material of the light modulating layer of the second lens zone 42 may include guest-host liquid crystal (GHLC), but it is not limited thereto. In some embodiments, the first lens zone 41 and the second lens zone 42 of the transmittance-adjustable lens 4R or 4L and the first light modulating layer 31 of the light modulating module 3 may be made of the same material, but not limited thereto. In some embodiments, the first lens zone 41 and the second lens zone 42 of the transmittance-adjustable lens 4R or 4L and the first light modulating layer 31 of the light modulating module 3 may be made of different materials, but it is not limited thereto. In one embodiment, the first lens zone 41 and the second lens zone 42 may share the same light modulating layer, but it is not limited thereto.

In some embodiments, cholesteric liquid crystals may be provided on a portion of the eyeglasses temple 8 so that the portion of the eyeglasses temple 8 may also achieve the effect of discoloration at different temperatures, but it is not limited thereto.

Figure 3B:
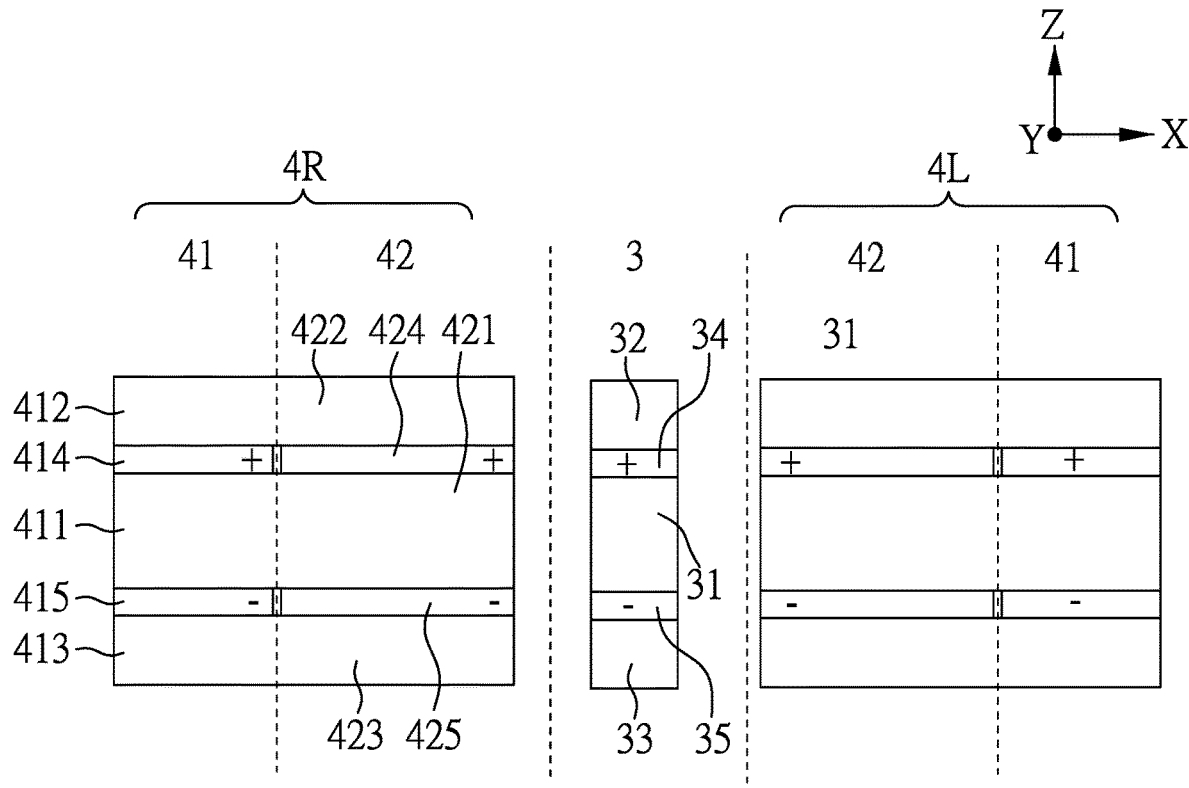
FIG. 3(B) schematically illustrates a cross-sectional view of the light modulating module and the transmittance-adjustable lens according to some embodiments of the disclosure.

Next, the internal structure of the transmittance-adjustable lens 4R or 4L will be described. FIG. 3(B) schematically illustrates a cross-sectional view of the light modulating module 3 and the transmittance-adjustable lens along the direction of the user's line of sight (Z direction) according to some embodiments of the disclosure, and please refer to FIG. 3(B) and FIGS. 1(A) to 3(A) at the same time, wherein FIG. 3(B) may show three independent regions, such as the transmittance-adjustable lens 4R, the light modulating module 3 and the transmittance-adjustable lens 4L. For the convenience of description, the transmittance-adjustable lens 4R is taken as an example in the following description.

As shown in FIG. 3(B), the first lens zone 41 of the transmittance-adjustable lens 4R may include a second light modulating layer 411, a third plate 412, a fourth plate 413, a third electrode layer 414 and a fourth electrode layer 415, wherein the fourth electrode layer 415 is disposed on the fourth plate 413, the second light modulating layer 411 is disposed on the fourth electrode layer 415, the third electrode layer 414 is disposed on the second light modulating layer 411, and the third plate 412 is disposed on the third electrode layer 414. By applying voltages with opposite polarities (for example, the first control signal) to the third electrode layer 414 and the fourth electrode layer 415 (the positive and negative polarities in FIG. 3(B) are only examples), the second light modulating layer 411 can be driven to change its transmittance state, thereby changing the transmittance of the first lens zone 41, but it is not limited thereto. In some embodiments, a voltage difference (for example, the first control signal) may be applied to the third electrode layer 414 and the fourth electrode layer 415 (for example, the fourth electrode layer 415 is a common voltage level or the fourth electrode layer 415 is a ground level, and the third electrode layer 414 provides a voltage level different from that of the fourth electrode layer 415), which may drive the second light modulating layer 411 to change its transmittance state, thereby changing the transmittance of the first lens zone 41, but it is not limited thereto. In some embodiments, the third electrode layer 414 and the fourth electrode layer 415 may have the same pattern, but it is not limited thereto. In some embodiments, the third electrode layer 414 and the fourth electrode layer 415 may have different patterns, but it is not limited thereto.

As shown in FIG. 3(B), the second lens zone 42 of the transmittance-adjustable lens 4R may include a third light modulating layer 421, a fifth plate 422, a sixth plate 423, a fifth electrode layer 424 and a sixth electrode layer 425, wherein the sixth electrode layer 425 is disposed on the sixth plate 423, the third light modulating layer 421 is disposed on the sixth electrode layer 425, the fifth electrode layer 424 is disposed on the third light modulating layer 421, and the fifth plate 422 is disposed on the fifth electrode layer 424. By applying voltages with opposite polarities (for example, the second control signal) to the fifth electrode layer 424 and the sixth electrode layer 425 (the positive and negative polarities in FIG. 3(B) are only examples), the third light modulating layer 421 can be driven to change its transmittance state, thereby changing the transmittance of the second lens zone 42, but it is not limited thereto. In some embodiments, a voltage difference (for example, the second control signal) can be applied to the fifth electrode layer 424 and the sixth electrode layer 425 (for example, the sixth electrode layer 425 is a common voltage level or the sixth electrode layer 425 is a ground level, and the fifth electrode layer 424 provides a voltage level different from that of the sixth electrode layer 425), which can drive the third light modulating layer 421 to change its transmittance state, thereby changing the transmittance of the second lens zone 42, but it is not limited thereto. In some embodiments, the fifth electrode layer 424 and the sixth electrode layer 425 may be provided with the same pattern, but it is not limited thereto. In some embodiments, the fifth electrode layer 424 and the sixth electrode layer 425 may be provided with different patterns, but it is not limited thereto.

In some embodiments, the structure of the transmittance-adjustable lens 4L may be the same as that of the transmittance-adjustable lens 4R, but it is not limited thereto. In some embodiments, the structure of the transmittance-adjustable lens 4L may be different from the transmittance-adjustable lens 4R in, for example, electrode pattern, electrode material, etc., but it is not limited thereto. In some embodiments, the transmittance-adjustable lens 4R and the transmittance-adjustable lens 4L may be integrally formed, or are each a single independent region, but it is not limited thereto.

In some embodiments, the structure of the light modulating module 3 may be adapted to the content of FIG. 1(B), and thus a detailed description is deemed unnecessary. By applying voltages with opposite polarities (such as the light modulating layer control signal) to the first electrode layer 34 and the second electrode layer 35, the first light modulating layer 31 may be driven to change its transmittance state, thereby changing the transmittance of the first light modulating layer 31, but it is not limited thereto. In some embodiments, a voltage difference (for example, the light modulating layer control signal) may be applied to the first electrode layer 34 and the second electrode layer 35 (for example, the second electrode layer 35 is a common voltage level or the second electrode layer 35 is a ground level, and the first electrode layer 34 provides a voltage level different from that of the second electrode layer 35), which can drive the first light modulating layer 31 to change its transmittance state, thereby changing the transmittance of the first light modulating layer 31, but it is not limited thereto. In some embodiments, the first electrode layer 34 and the second electrode layer 35 may be provided with the same pattern, but it is not limited thereto. In some embodiments, the first electrode layer 34 and the second electrode layer 35 may be provided with different patterns, but it is not limited thereto.

In some embodiments, the third plate 412, the fourth plate 413, the fifth plate 422, the sixth plate 423, the first plate 32 and/or the second plate 33 may include glass, quartz, sapphire, polyamide (PI), polyethylene terephthalate (PET), other suitable materials or a combination thereof for use as flexible or rigid plates, but not limited thereto. In some embodiments, the third electrode layer 414, the fourth electrode layer 415, the fifth electrode layer 424, the sixth electrode layer 425, the first electrode layer 34 and/or the second electrode layer 35 may be transparent conductive electrodes, but not limited thereto.

In some embodiments, the material of the third electrode layer 414 and the fourth electrode layer 415 of the first lens zone 41 or the first electrode layer 34 and the second electrode layer 35 of the light modulating module 3 may include metal material, such as aluminum (Al), copper (Cu), nickel (Ni), molybdenum (Mo), titanium (Ti), etc., but it is not limited thereto.

In some embodiments, the material of the fifth electrode layer 424 and the sixth electrode layer 425 of the second lens zone 42 may include transmittance coating oxides, such as indium tin oxide (ITO) or indium zinc oxide (IZO), etc., but it is not limited thereto. In some embodiments, the fifth electrode layer 424 and the sixth electrode layer 425 may be coated with a multilayer film (not shown in the figure), wherein the material of the multilayer film may include silver (Ag) to isolate infrared rays, ultraviolet rays, etc., but it is not limited thereto.

As shown in FIG. 3(B), in some embodiments, the third plate 412, the fifth plate 422 and the first plate 32 may be the same plate, but it is not limited thereto. In some embodiments, the fourth plate 413, the sixth plate 423 and the second plate 33 may also be the same plate, but it is not limited thereto. In some embodiments, the second light modulating layer 411, the third light modulating layer 421 and the first light modulating layer 31 may be the same light modulating layer, but it is not limited thereto. In the case of using the same plate or light modulating layer, the light modulating module 3, the first lens zone 41 and the second lens zone 42 may be distinguished by different electrode layer patterns; that is, the third electrode layer 414 (or the fourth electrode layer 415), the fifth electrode layer 424 (or the sixth electrode layer 425), and the first electrode layer 34 (or the second electrode layer 35) may be provided with different patterns. However, the present disclosure is not limited thereto. In this way, the internal structure of the light modulating module 3 and the transmittance-adjustable lens 4 can be understood.

Figure 4A:
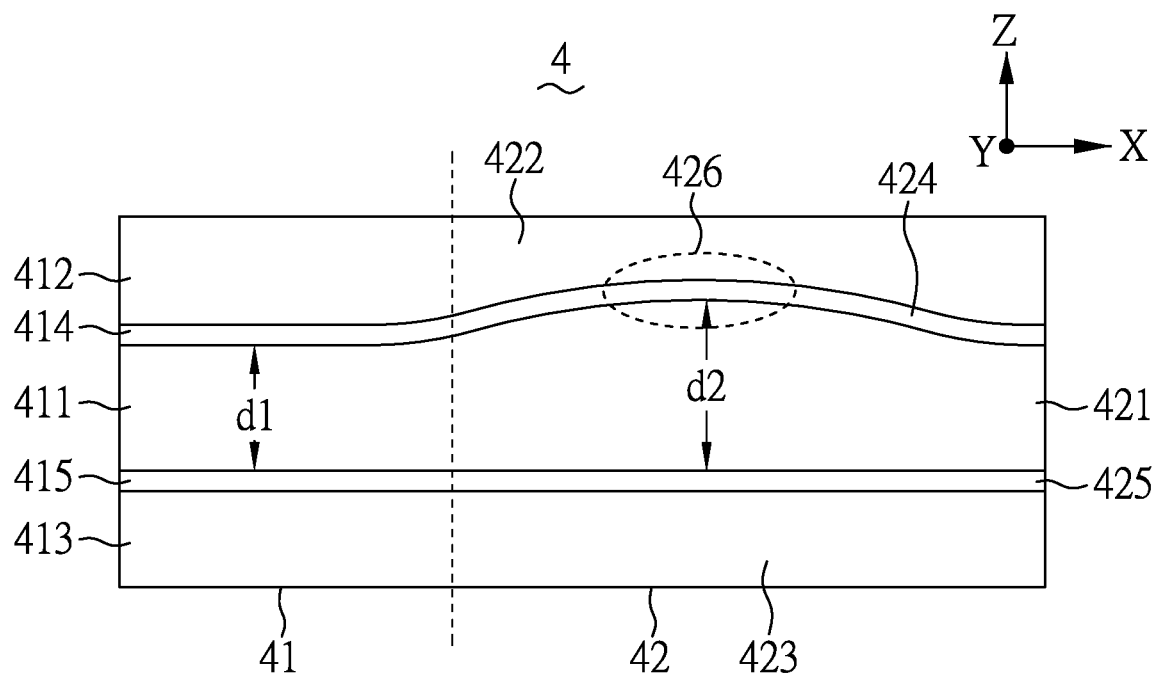
FIG. 4(A) schematically illustrates a cross-sectional view of the first lens zone and the second lens zone according to some embodiments of the present disclosure.

Next, some implementation aspects of the transmittance-adjustable lens 4 will be described. FIG. 4(A) schematically illustrates a cross-sectional view of the first lens zone 41 and the second lens zone 42 according to some embodiments of the present disclosure, and please refer to FIG. 4(A) and FIGS. 1(A) to 3(B) at the same time. For the convenience of explanation, the transmittance-adjustable lens 4R is taken as an example in the following description.

Figure 4B:
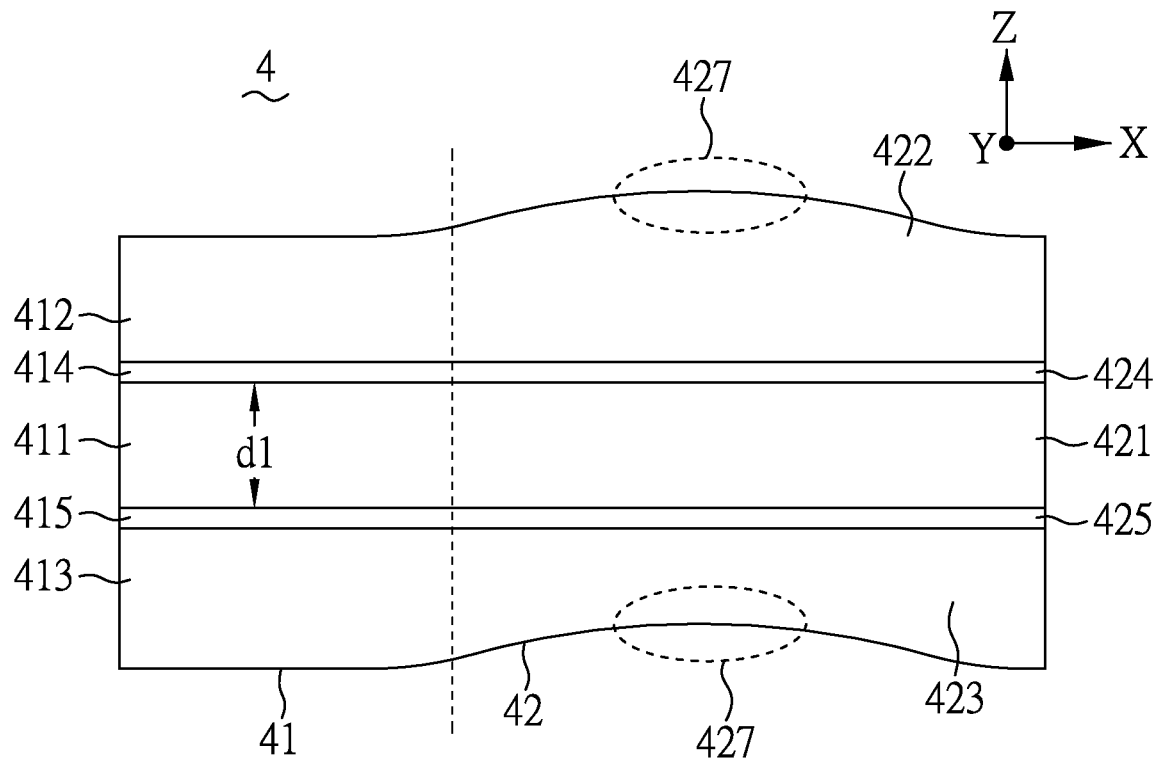
FIG. 4(B) schematically illustrates a cross-sectional view of the first lens zone and the second lens zone according to some embodiments of the present disclosure.

As shown in FIG. 4(A), when viewing along the direction of the user's line of sight (Z direction), the second light modulating layer 411 of the first lens zone 41 has a first thickness d1, in which the first thickness d1 may be the average thickness of the second light modulating layer 411 in the direction of the user's line of sight (Z direction), where the average thickness may be an average value of any three points in a cross section. The third light modulating layer 421 of the second lens zone 42 has a second thickness d2, in which the second thickness d2 is defined as the average thickness of the third light modulating layer 421 in the direction of the user's line of sight (Z direction), where the average thickness may be an average value of any three points in a cross section. In some embodiments, the first thickness d1 is different from the second thickness d2; for example, the first thickness d1 is smaller than the second thickness d2. In some embodiments, the first thickness d1 may be between 3 and 500 micrometers (μm) (3 μm≤d1≤500 μm), and the first thickness d1 is smaller than the second thickness d2, but it is not limited thereto. In some embodiments (not shown in the figure), the first thickness d1 is different from the second thickness d2; for example, the first thickness d1 is greater than the second thickness d2. In some embodiments, the first thickness d1 may be between 3 and 500 micrometers (μm) (3 μm≤d1≤500 μm), and the first thickness d1 is greater than the second thickness d2, but it is not limited thereto. In addition, in this embodiment, the third light modulating layer 421 and the fifth electrode layer 424 are provided with an arc-shaped convex region 426 protruding along the direction of the user's line of sight (Z direction). With the arc-shaped convex region 426 in combination with the transmittance of the second lens zone 42, the focal length of the second lens zone 42 for the incident light may be adjusted, which may present an effect similar to a nearsightedness lens or farsightedness lens. FIG. 4(B) schematically illustrates a cross-sectional view of the first lens zone 41 and the second lens zone 42 according to some embodiments of the present disclosure, and please refer to FIG. 4(B) and FIGS. 1(A) to 4(A) at the same time. For the convenience of description, the transmittance-adjustable lens 4R is taken as an example in the following description.

As shown in FIG. 4(B), the second light modulating layer 411 and the third light modulating layer 421 have the same thickness (for example, both have the first thickness d1). In addition, the fifth plate 422 and the sixth plate 423 may have a concave lens or a convex lens structure 427. In this way, with the concave lens or convex lens structure 427 in combination with the transmittance of the second lens zone 42, the focal length of the second lens zone 42 for the incident light may be adjusted, which present an effect similar to a nearsightedness lens or farsightedness lens.

Figure 4C:
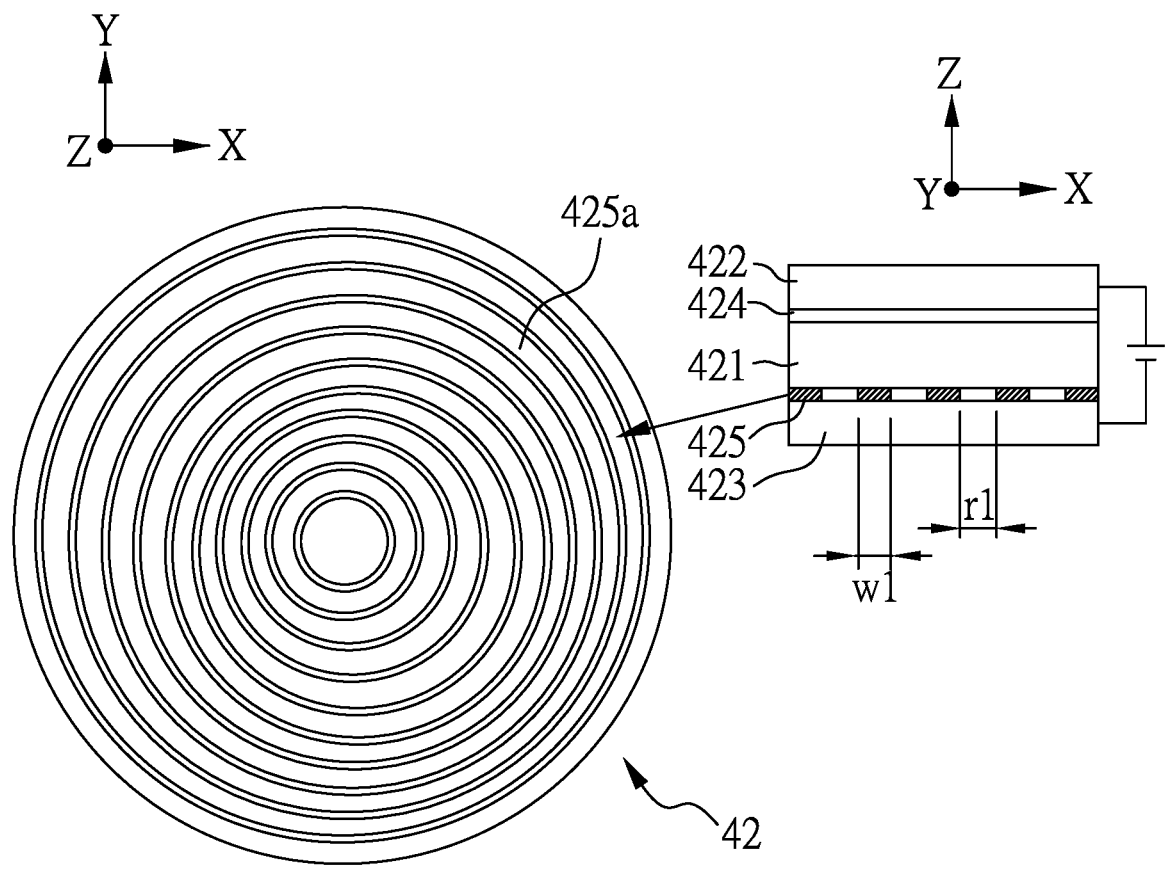
FIG. 4(C) is a schematic diagram and a cross-sectional view of the second lens zone according to some embodiments of the present disclosure.

FIG. 4(C) is a schematic diagram and a cross-sectional view of the second lens zone 42 according to some embodiments of the present disclosure, and please refer to FIG. 4(C) and FIGS. 1(A) to 4(B) at the same time. For the convenience of description, the transmittance-adjustable lens 4R is taken as an example in the following description. The left half of FIG. 4(C) schematically illustrates the second lens zone 42 in the direction of the user's line of sight (Z direction), and the right half thereof schematically illustrates a cross-sectional view of the second lens zone 42.

As shown in FIG. 4(C), when viewing the sixth electrode layer 425 of the second lens zone 42 in the direction of the user's line of sight (Z direction), the sixth electrode layer 425 may include a plurality of ring-shaped electrodes 425a of different sizes. In some embodiments, the sixth electrode layer 425 includes ring electrodes 425a of different sizes, and the ring-shaped electrodes 425a are arranged in order according to the sizes and surround each other. Therefore, the second lens zone 42 may be formed to have an effect similar to a Fresnel lens. Therefore, when a different voltage (for example, electric control) or light energy (for example, light control) is applied to the sixth electrode layer 425, the second lens zone 42 may produce an effect similar to a convex lens or a concave lens, thereby presenting an effect similar to a nearsightedness lens or farsightedness lens.

In some embodiments, there is a gap r1 between every two adjacent ring-shaped electrodes 425a, wherein the gap r1 may be in a range of 1.5 to 4.5 micrometers (μm) (that is, 1.5 μm≤r1≤4.5 μm), but is not limited thereto. In some embodiments, each ring-shaped electrode 425a has a width w1, where the width w1 may be in a range of 1.5 to 4.5 micrometers (μm) (that is, 1.5 μm≤w1≤4.5 μm), but is not limited thereto.

In some embodiments, the light modulating module 3 in the aforementioned embodiments may also adopt the concept of this embodiment, for example, may include a plurality of ring-shaped electrodes to form the effect of a Fresnel lens.

As a result, some implementation aspects of the transmittance-adjustable lens 4 can be understood.

Figure 5:
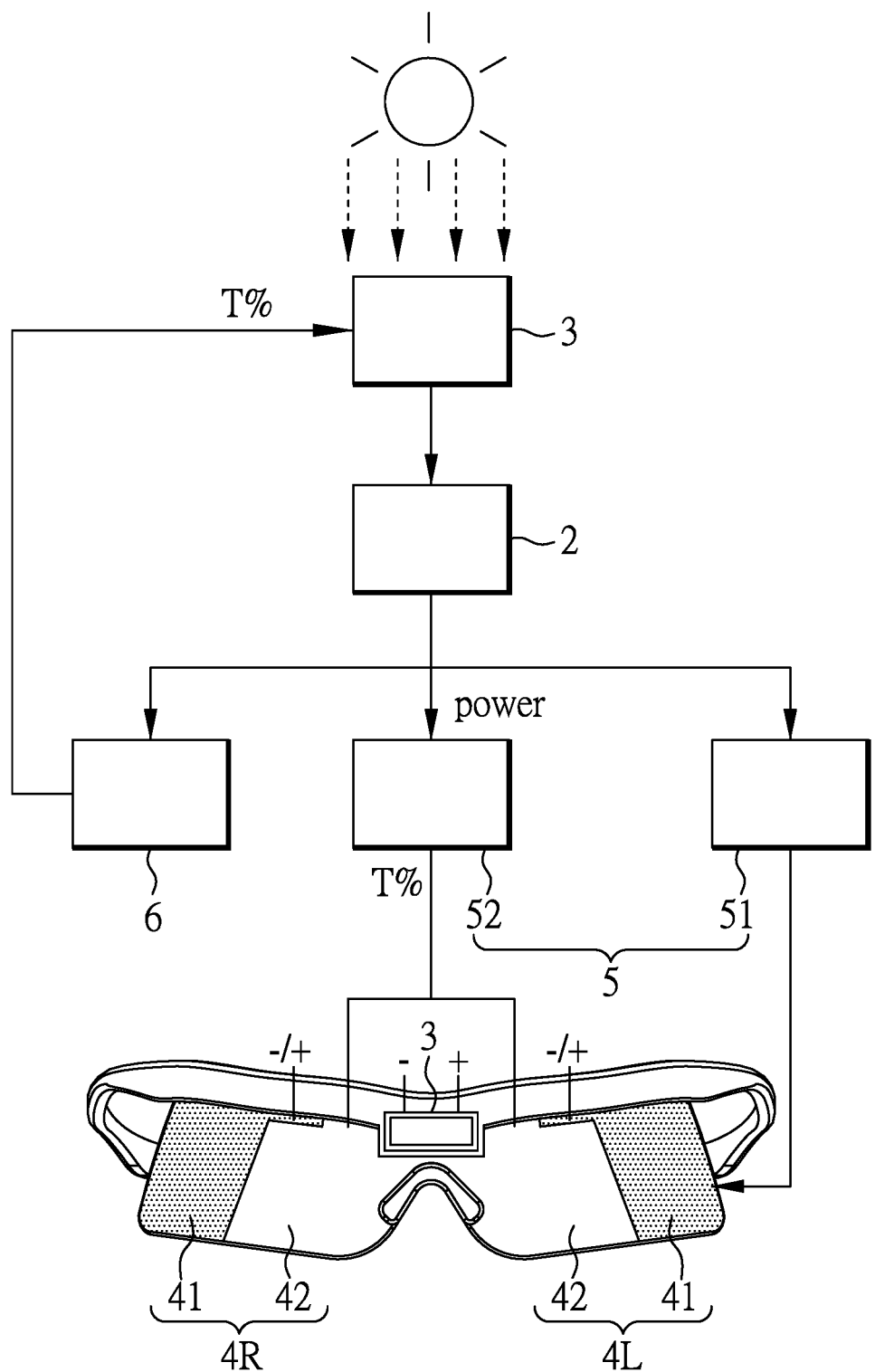
FIG. 5 is a schematic diagram illustrating a detailed structure of the electronic device according to some embodiments of the present disclosure.

FIG. 5 is a schematic diagram illustrating a detailed structure of the electronic device 1 according to some embodiments of the present disclosure, and please refer to FIG. 5 and FIGS. 1(A) to 4(C) at the same time. Part of the features of the embodiment in FIG. 5 is similar to those of the embodiment in FIG. 2(A), and thus the description of the embodiment in FIG. 2(A) can be applied to the similar part, while FIG. 5 is described as follows. All the components labeled in FIG. 5 are contained inside the electronic device 1. It is noted that FIG. 5 is only for illustration, and does not mean that the labeled components are placed outside the electronic device 1.

As shown in FIG. 5, the control circuit 5 of the electronic device 1 may include a light modulating layer control circuit 6, a first control circuit 51, and a second control circuit 52. The solar cell 2 is electrically connected to the first control circuit 51, the second control circuit 52 and the light modulating layer control circuit 6. The first control circuit 51 is electrically connected to the first lens zone 41 for transmitting a first control signal to the first lens zone 41. The second control circuit 52 is electrically connected to the second lens zone 42 for transmitting a second control signal to the second lens zone 42. In this way, the light modulating module 3, the first lens zone 41 and the second lens zone 42 may be controlled by different control circuits, respectively.

In some embodiments, the first control circuit 51, the second control circuit 52, and the light modulating layer control circuit 6 may be integrated together, for example, may be integrated in the same chip, but it is not limited thereto.

In some embodiments, the light modulating layer control circuit 6 may be provided with a control logic (such as, but not limited to, an algorithm) to calculate the overall energy demand value or set the energy threshold accordingly based on the transmittance required by each of the first lens zone 41 and the second lens zone 42, but it is not limited thereto.

As a result, the structural details of the electronic device 1 can be understood.

Figure 6A:
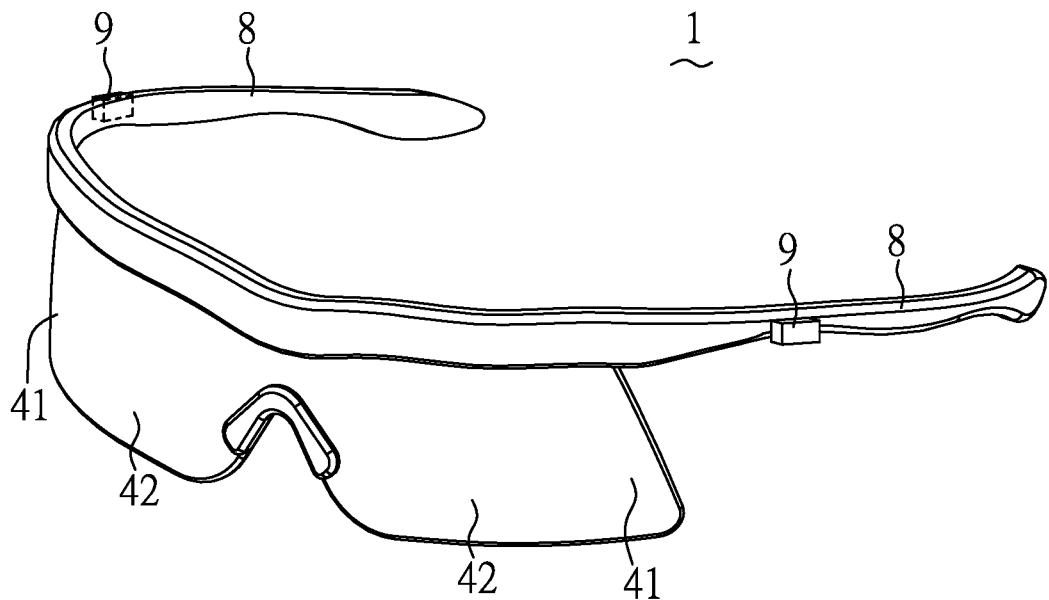
FIG. 6(A) is a schematic diagram illustrating an extended application of the electronic device according to some embodiments of the present disclosure.

FIG. 6(A) is a schematic diagram illustrating an extended application of the electronic device 1 according to some embodiments of the present disclosure, and please refer to FIG. 6(A) and FIGS. 1(A) to 5 at the same time.

As shown in FIG. 6(A), the electronic device 1 may include an eyeglasses temple 8 and a projection device 9. The projection device 9 may be arranged on the eyeglasses temple 8, and thus, when the user wears the electronic device 1, the projection device 9 may be disposed on the side of the user's head. In some embodiments, when the user wears the electronic device 1, the projection device 9 may project the projection image onto the first lens zone 41, but it is not limited thereto. In this embodiment, the light path of the projection image of the projection device 9 may include the plastic of the eyeglasses temple 8, the third plate 412, the fifth plate 422, the fourth plate 413 or the sixth plate 423 of the first lens zone 41 or the second lens zone 42 (please refer to FIG. 3(B)), or the second light modulating layer 411, the third electrode layer 414, the third light modulating layer 421 or the fifth electrode layer 424 (please refer to FIG. 3(B)), but is not limited thereto. By adjusting the light path of the projection image, the projection image may be projected to a specific region. However, the present disclosure is not limited thereto.

Figure 6B:
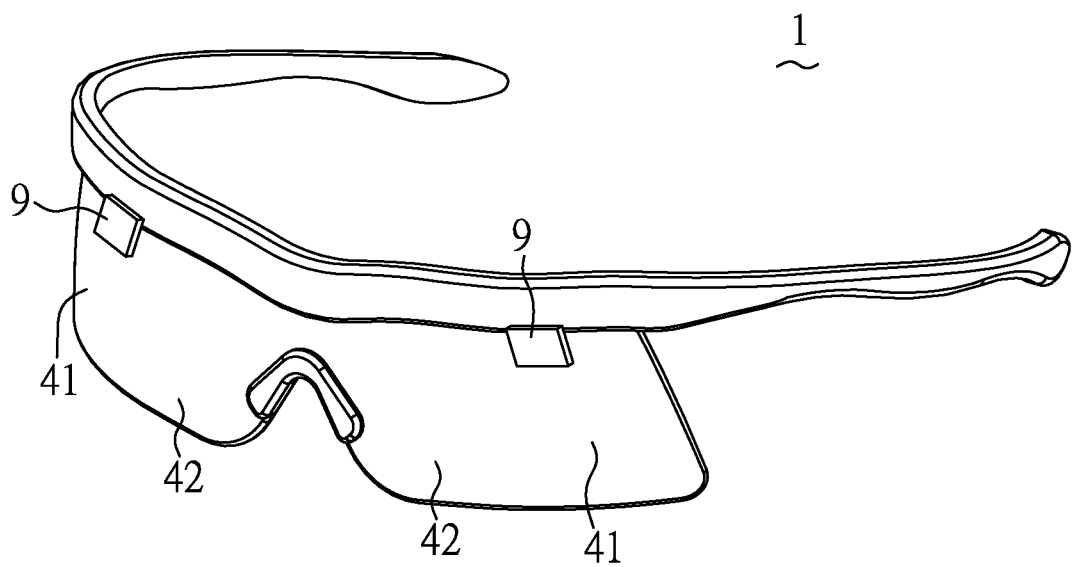
FIG. 6(B) is a schematic diagram illustrating an extended application of the electronic device according to some embodiments of the present disclosure.

FIG. 6(B) is a schematic diagram illustrating an extended application of the electronic device 1 according to some embodiments of the present disclosure, and please refer to FIG. 6(B) and FIGS. 1(A) to 6(A) at the same time.

Similar to the embodiment of FIG. 6(A), the electronic device 1 of the embodiment of FIG. 6(B) may also include a projection device 9, wherein the projection device 9 may be disposed above the outer side of the first lens zone 41. In some embodiments, when the user wears the electronic device 1, the projection device 9 may transmit an image signal from the outer side of the first lens zone 41 toward the first lens zone 41. In some embodiments, part of the image signal may penetrate the first lens zone 41 and be transmitted to the user's eyes. In this embodiment, the light path of the projection image of the projection device 9 may include the third plate 412, the fifth plate 422, the fourth plate 413 or the sixth plate 423 of the first lens zone 41 or the second lens zone 42 (please refer to FIG. 3(B)), or the second light modulating layer 411, the third electrode layer 414, the third light modulating layer 421 or the fifth electrode layer 424 (please refer to FIG. 3(B)), but it is not limited thereto. By adjusting the light path of the projection image, the projection image may be projected to a specific region. However, the present disclosure is not limited thereto.

Figure 7:
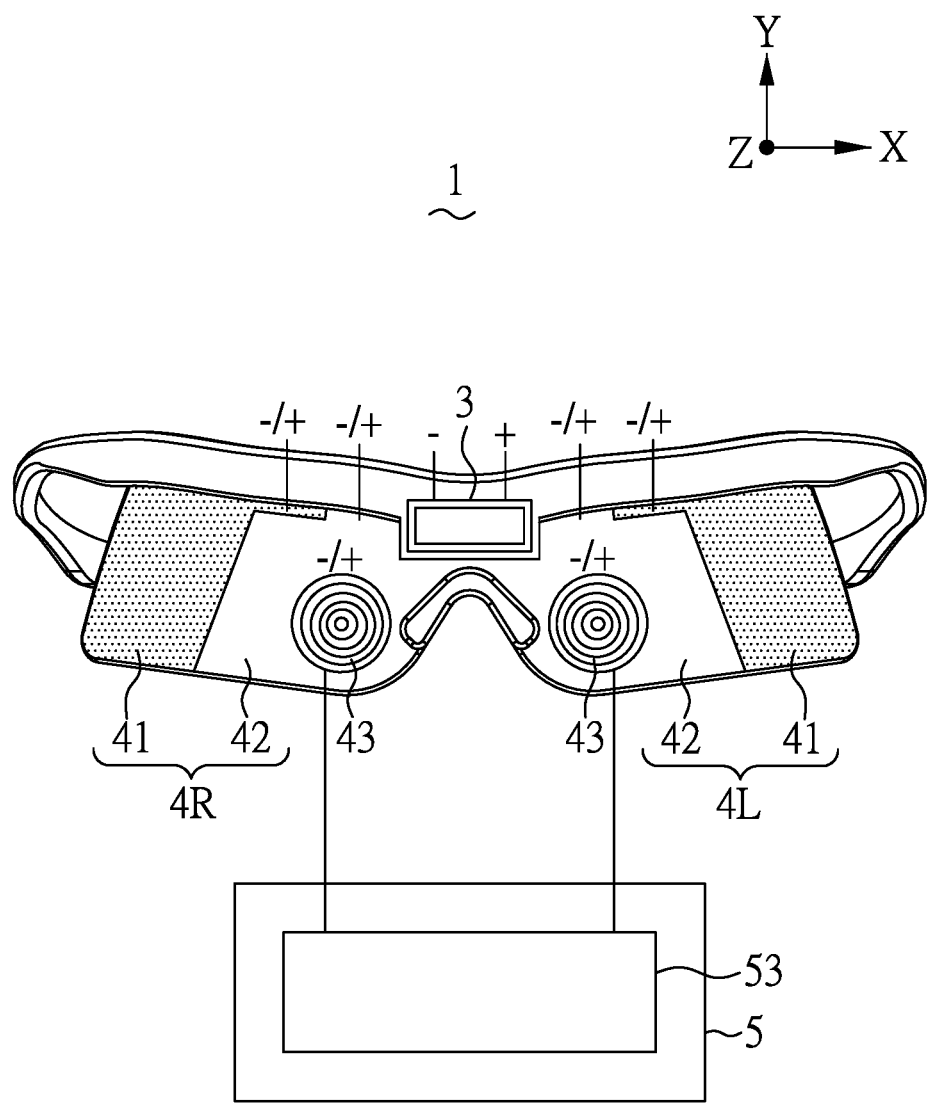
FIG. 7 is a schematic diagram of the light modulating module and the transmittance-adjustable lens according to some embodiments of the present disclosure.

FIG. 7 is a schematic diagram of the light modulating module 3 and the transmittance-adjustable lens 4 according to some embodiments of the present disclosure, and please refer to FIG. 7 and FIGS. 1(A) to 6(B) at the same time. Part of the features of the embodiment in FIG. 7 may be known from the description of the embodiment in FIG. 3(A), and the FIG. 7 is described as follows.

As shown in FIG. 7, the second lens zone 42 of the transmittance-adjustable lens 4R or the transmittance-adjustable lens 4L further includes a third lens zone 43, wherein the third lens zone 43 may include a plurality of ring-shaped electrodes so as to form a Fresnel lens that can be controlled electrically or by light (please refer to the description of FIG. 4(C)). In some embodiments, the control circuit 5 further includes a third control circuit 53 electrically connected to the third lens zone 43 and the solar cell 2 for transmitting a third control signal to the third lens zone 43.

In some embodiments, the transmittances of the second lens zone 42 and the third lens zone 43 may be controlled by different control circuits. Therefore, when the user wears the electronic device 1, the second lens zone 42 and the third lens zone 43 may provide different focal lengths, so that the electronic device 1 may provide a plurality of viewing regions thereby providing a multi-focus line-of-sight function. However, the present disclosure is not limited thereto. All the components labeled in FIG. 7 are contained inside the electronic device 1. It is noted that FIG. 7 is only an illustration, and the labeled components are not placed outside the electronic device 1.

Figure 8:
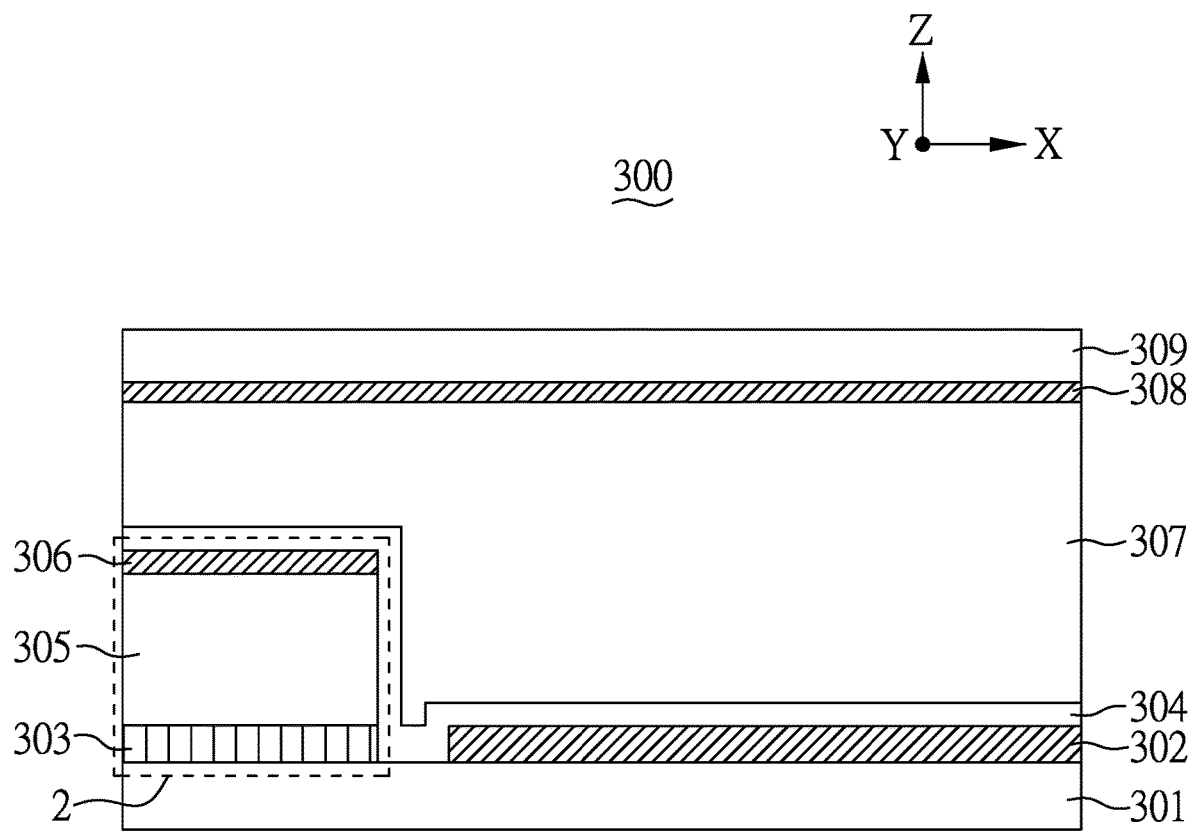
FIG. 8 schematically illustrates a cross-sectional view of an integrated structure of the light modulating layer and the solar cell according to some embodiments of the present disclosure.

In addition, in the present disclosure, the first light modulating layer 31 of the light modulating module 3 and the solar cell 2 in the aforementioned embodiments may be integrated together. FIG. 8 schematically illustrates a cross-sectional view of an integrated structure 300 of the light modulating layer and the solar cell 2 according to some embodiments of the present disclosure, wherein, the solar cell 2 and the light modulating layer are sandwiched in between two plates.

As shown in FIG. 8, the integrated structure 300 may be a structure in which the solar cell 2 and a fourth light modulating layer 307 are sandwiched in between a seventh plate 301 and an eighth plate 309, and at least a portion of the fourth light modulating layer 307 may be disposed above the solar cell 2. In some embodiments, the material of the fourth light modulating layer 307 may be the same as the material of the first light modulating layer 31 described above, and thus a detailed description is deemed unnecessary. As shown in FIG. 8, the integrated structure 300 includes a seventh plate 301, a seventh electrode layer 302, a metal layer 303, a nitride layer 304 (for example, a silicon nitride (SiNx) layer), a PIN junction layer 305, an eighth electrode layer 306, a fourth light modulating layer 307, a ninth electrode layer 308, and an eighth plate 309. The solar cell 2 may include the metal layer 303, the PIN junction layer 305, and the eighth electrode layer 306. When viewing in the direction of the line of sight (Z direction), the seventh electrode layer 302 and the metal layer 303 are disposed on the seventh plate 301, the PIN junction layer 305 is disposed on the metal layer 303, the eighth electrode layer 306 is disposed on the PIN junction layer 305, the nitride layer 304 is disposed on the eighth electrode layer 306, part of the seventh plate 301 and the seventh electrode layer 302, the fourth light modulating layer 307 is disposed on the nitride layer 304, and the ninth electrode layer 308 is disposed between an eighth plate 309 and a fourth light modulating layer 307.

In some embodiments, the material of the seventh electrode layer 302, the eighth electrode layer 306 and the ninth electrode layer 308 may be similar to the material described in the aforementioned embodiments, but it is not limited thereto. In some embodiments, the aforementioned electrode layer material may be a single-layer or multi-layer structure, and the present disclosure is not limited thereto. In some embodiments, the aforementioned electrode layer may include a single-layer or multi-layer structure, and the present disclosure is not limited thereto. In some embodiments, the electrode layer material may include metallic material or non-metallic material, and the present disclosure is not limited thereto.

In some embodiments, the seventh plate 301 may be a rigid plate or a flexible plate.

In some embodiments, the integrated structure 300 may control the transmittance of the fourth light modulating layer 307 through touch control, but it is not limited thereto. In some embodiments, the integrated structure 300 may control the transmittance of the fourth light modulating layer 307 by applying voltages as in the aforementioned embodiments (for example, applying voltages of opposite polarities to the seventh electrode layer 302 and the ninth electrode layer 308), but it is not limited thereto. In some embodiments, the integrated structure 300 may be provided with the aforementioned two methods for controlling the transmittance of the fourth light modulating layer 307 at the same time.

As a result, the integrated structure 300 of the light modulating layer 307 and the solar cell 2 can be understood.

The present disclosure may at least be used as proof of whether an object falls within the scope of patent protection by comparing the presence or absence of components in the electronic device 1 and the connection mode, and it is not limited thereto.

The electronic device 1 manufactured by the aforementioned embodiment may be combined with a touch panel to form a touch device. Furthermore, if the electronic device 1 manufactured by the aforementioned embodiment is a display device or a touch display device, it may be applied to any products known in the art that require a display screen to display images, such as displays, mobile phones, notebook computers, camcorders, cameras, music players, mobile navigation devices, television sets, car dashboards, center consoles, electronic rearview mirrors, head-up displays, etc.

Accordingly, the present disclosure provides an improved electronic device 1, which can adjust the energy received by the solar cell according to the light intensity in the environment, so as to avoid energy waste or damage to electronic components. Or, the electronic device 1 of the present disclosure can be applied to an outdoor environment and an indoor environment, for example, the lens is rendered non-transparent in an indoor environment.

The features of the embodiments disclosed in the present disclosure may be mixed and matched arbitrarily as long as they do not violate the spirit of the disclosure or conflict with each other.

The aforementioned specific embodiments should be construed as merely illustrative, and not limiting the rest of the present disclosure in any way.

What is claimed is:

1. An electronic device, comprising:
   a solar cell;
   a first light modulating layer, wherein at least a portion of the first light modulating layer is disposed on the solar cell;
   at least one transmittance-adjustable lens; and
   a control circuit electrically connected to the solar cell and the transmittance-adjustable lens;
   wherein the electronic device further comprises a light modulating module and a light modulating layer control circuit, wherein the light modulating module includes the first light modulating layer, and the light modulating layer control circuit is electrically connected to the light modulating module and the solar cell;
   wherein the light modulating layer control circuit is used to transmit a light modulating layer control signal to the light modulating module, so as to adjust the transmittance of the first light modulating layer thereby adjusting the energy radiated to the solar cell.

2. The electronic device of claim 1, wherein the transmittance-adjustable lens includes a first lens zone and a second lens zone.

3. The electronic device of claim 2, wherein the control circuit provides a first control signal to the first lens zone, and provides a second control signal to the second lens zone.

4. The electronic device of claim 2, wherein the first lens zone includes a second light modulating layer, the second lens zone includes a third light modulating layer, the second light modulating layer has a first thickness, and the third light modulating layer has a second thickness, wherein the first thickness is different from the second thickness.

5. The electronic device of claim 2, wherein the transmittance-adjustable lens further comprises a third lens zone, where the third lens zone comprises a Fresnel lens that is controlled electronically or by light.

6. The electronic device of claim 2, wherein the first lens zone and the second lens zone share the same light modulating layer.

7. The electronic device of claim 1, wherein the transmittance-adjustable lens comprises a Fresnel lens that is controlled electrically or by light.

8. The electronic device of claim 1, wherein the solar cell and the first light modulating layer are sandwiched in between two plates.

9. The electronic device of claim 1, wherein the solar cell and the first light modulating layer are separated by a plate.

10. The electronic device of claim 1, wherein the light modulating module further comprises a first plate, a second plate, a first electrode layer and a second electrode layer, and the first light modulating layer is sandwiched in between the first plate and the second plate and disposed between the second electrode layer and the first electrode layer.

11. The electronic device of claim 10, wherein, by applying different voltages to the first electrode layer and the second electrode layer, the first light modulating layer generates different driving states to change transmittance of the first light modulating layer.

12. The electronic device of claim 1, wherein the control circuit has an energy demand value, and the control circuit receives an amount of energy based on the energy demand value from energy provided by the solar cell, and dissipates remaining energy.

13. The electronic device of claim 1, wherein the energy demand value changes with transmittance of the at least one transmittance-adjustable lens.

14. The electronic device of claim 1, wherein the energy demand value is an energy upper limit that the control circuit can receive.

15. The electronic device of claim 1, wherein the light modulating layer control circuit transmits the light modulating layer control signal to the light modulating module according to received energy provided by the solar cell.

16. The electronic device of claim 15, wherein the light modulating layer control circuit has a predetermined energy threshold to determine adjustment of the transmittance of the first light modulating layer according to a comparison between the energy threshold and energy provided by the solar cell to the control circuit.

17. The electronic device of claim 5, wherein the third lens zone comprises a plurality of ring-shaped electrodes.

18. The electronic device of claim 5, wherein the control circuit further comprises a third control circuit electrically connected to the third lens zone and the solar cell for transmitting a third control signal to the third lens zone.

* * * * *